(12) United States Patent
Gupta

(10) Patent No.: US 9,040,816 B2
(45) Date of Patent: May 26, 2015

(54) METHODS AND APPARATUS FOR FORMING PHOTOVOLTAIC CELLS USING ELECTROSPRAY

(75) Inventor: Anand Gupta, Phoenix, AZ (US)

(73) Assignee: Nanocopoeia, Inc., St. Paul, MN (US)

( * ) Notice: Subject to any disclaimer, the term of this patent is extended or adjusted under 35 U.S.C. 154(b) by 1690 days.

(21) Appl. No.: 11/953,758

(22) Filed: Dec. 10, 2007

(65) Prior Publication Data

US 2008/0210302 A1   Sep. 4, 2008

Related U.S. Application Data

(60) Provisional application No. 60/869,205, filed on Dec. 8, 2006.

(51) Int. Cl.
| | |
|---|---|
| H01L 31/04 | (2014.01) |
| C23C 18/12 | (2006.01) |
| H01L 31/0384 | (2006.01) |
| H01L 31/18 | (2006.01) |
| H01G 9/20 | (2006.01) |
| H01L 27/30 | (2006.01) |

(52) U.S. Cl.
CPC .............. *H01L 31/18* (2013.01); *H01G 9/2054* (2013.01); *H01G 9/2027* (2013.01); *H01G 9/2063* (2013.01); *H01G 9/2036* (2013.01); *Y02E 10/50* (2013.01); *H01G 9/20* (2013.01); *C23C 18/1208* (2013.01); *H01G 9/2031* (2013.01); *H01G 9/2059* (2013.01); *H01G 9/2068* (2013.01); *H01L 27/304* (2013.01); *H01L 31/0384* (2013.01); *Y02E 10/542* (2013.01)

(58) Field of Classification Search
CPC . H01G 9/2027; H01G 9/2036; H01G 9/2031; H01G 9/2054; H01G 9/2063; H01G 9/20; Y02E 10/50
USPC .................................................. 136/260, 263
See application file for complete search history.

(56) References Cited

U.S. PATENT DOCUMENTS

| | | |
|---|---|---|
| 3,521,125 A | 7/1970 | Nelson |
| 3,608,823 A | 9/1971 | Buschor |
| 3,654,534 A | 4/1972 | Fischer |
| 4,002,777 A | 1/1977 | Juvinall et al. |
| 4,039,145 A | 8/1977 | Felici et al. |

(Continued)

FOREIGN PATENT DOCUMENTS

| | | |
|---|---|---|
| CA | 2435721 | 8/2002 |
| CA | 2436524 | 8/2002 |

(Continued)

OTHER PUBLICATIONS

Nozik, "Quantum Dot Solar Cells", Physica E, 2002.*

(Continued)

*Primary Examiner* — Matthew Martin
(74) *Attorney, Agent, or Firm* — Schwegman Lundberg & Woessner, P.A.

(57) ABSTRACT

Methods of forming a photovoltaic structures including nanoparticles are disclosed. The method includes electrospray deposition of nanoparticles. The nanoparticles can include $TiO_2$ nanoparticles and quantum dots. In an example, the nanoparticles are formed on a flexible substrate. In various examples, the flexible substrate is light transparent. Photovoltaic structures and apparatus for forming photovoltaic structures are disclosed.

28 Claims, 5 Drawing Sheets

(56) References Cited

U.S. PATENT DOCUMENTS

| | | | |
|---|---|---|---|
| 4,265,641 A | 5/1981 | Natarajan | |
| 4,328,940 A | 5/1982 | Malcolm | |
| 4,414,603 A | 11/1983 | Masuda | |
| 4,476,515 A | 10/1984 | Coffee | |
| 4,578,290 A | 3/1986 | Komon et al. | |
| 4,634,057 A | 1/1987 | Coffee et al. | |
| 4,659,012 A | 4/1987 | Coffee | |
| 4,748,043 A | 5/1988 | Seaver et al. | |
| 4,749,125 A | 6/1988 | Escallon et al. | |
| 4,795,330 A | 1/1989 | Noakes et al. | |
| 4,846,407 A | 7/1989 | Coffee et al. | |
| 4,945,050 A | 7/1990 | Sanford et al. | |
| 4,946,899 A | 8/1990 | Kennedy et al. | |
| 5,036,006 A | 7/1991 | Sanford et al. | |
| 5,044,564 A | 9/1991 | Sickles | |
| 5,066,587 A | 11/1991 | Jones | |
| 5,091,205 A | 2/1992 | Fan | |
| 5,100,792 A | 3/1992 | Sanford et al. | |
| 5,120,657 A | 6/1992 | McCabe et al. | |
| 5,141,131 A | 8/1992 | Miller, Jr. et al. | |
| 5,149,655 A | 9/1992 | McCabe et al. | |
| 5,179,022 A | 1/1993 | Sanford et al. | |
| 5,204,253 A | 4/1993 | Sanford et al. | |
| 5,219,746 A | 6/1993 | Brinegar et al. | |
| 5,222,663 A | 6/1993 | Noakes et al. | |
| 5,240,842 A | 8/1993 | Mets | |
| 5,247,842 A | 9/1993 | Kaufman et al. | |
| 5,354,556 A | 10/1994 | Sparks et al. | |
| 5,371,015 A | 12/1994 | Sanford et al. | |
| 5,433,865 A | 7/1995 | Laurent | |
| 5,457,041 A | 10/1995 | Ginaven et al. | |
| 5,475,228 A | 12/1995 | Palathingal | |
| 5,478,744 A | 12/1995 | Sanford et al. | |
| 5,506,125 A | 4/1996 | McCabe et al. | |
| 5,516,670 A | 5/1996 | Kuehnle et al. | |
| 5,525,510 A | 6/1996 | McCabe et al. | |
| 5,584,807 A | 12/1996 | McCabe | |
| 5,621,605 A | 4/1997 | Inaba | |
| 5,655,517 A | 8/1997 | Coffee | |
| 5,683,556 A | 11/1997 | Nomura et al. | |
| 5,685,482 A | 11/1997 | Sickles | |
| 5,702,754 A | 12/1997 | Zhong | |
| 5,807,436 A | 9/1998 | Stachelhaus et al. | |
| 5,813,614 A | 9/1998 | Coffee | |
| 5,837,313 A | 11/1998 | Ding et al. | |
| 5,846,595 A | 12/1998 | Sun et al. | |
| 5,866,400 A | 2/1999 | Palsson et al. | |
| 5,873,523 A | 2/1999 | Gomez et al. | |
| 5,897,911 A | 4/1999 | Loeffler | |
| 5,915,377 A | 6/1999 | Coffee | |
| 5,973,904 A | 10/1999 | Pui et al. | |
| 5,980,972 A | 11/1999 | Ding | |
| 5,992,244 A | 11/1999 | Pui et al. | |
| 6,068,199 A | 5/2000 | Coffee | |
| 6,074,688 A | 6/2000 | Pletcher et al. | |
| 6,093,557 A | 7/2000 | Pui et al. | |
| 6,096,070 A | 8/2000 | Ragheb et al. | |
| 6,105,571 A | 8/2000 | Coffee | |
| 6,105,877 A | 8/2000 | Coffee | |
| 6,120,847 A | 9/2000 | Yang et al. | |
| 6,126,086 A | 10/2000 | Browner et al. | |
| 6,143,037 A | 11/2000 | Goldstein et al. | |
| 6,143,370 A | 11/2000 | Panagiotou et al. | |
| 6,145,391 A | 11/2000 | Pui et al. | |
| 6,207,195 B1 | 3/2001 | Walsh et al. | |
| 6,251,136 B1 | 6/2001 | Guruwaiya et al. | |
| 6,252,129 B1 | 6/2001 | Coffee | |
| 6,277,448 B2 | 8/2001 | Strutt et al. | |
| 6,291,763 B1 * | 9/2001 | Nakamura | 136/256 |
| 6,300,559 B1 * | 10/2001 | Ohmori | 136/263 |
| 6,364,903 B2 | 4/2002 | Tseng et al. | |
| 6,368,658 B1 | 4/2002 | Schwarz et al. | |
| 6,399,362 B1 | 6/2002 | Pui et al. | |
| 6,419,692 B1 | 7/2002 | Yang et al. | |
| 6,419,745 B1 | 7/2002 | Burkett et al. | |
| 6,517,888 B1 | 2/2003 | Weber | |
| 6,579,573 B2 | 6/2003 | Strutt et al. | |
| 6,632,671 B2 | 10/2003 | Unger | |
| 6,645,569 B2 | 11/2003 | Cramer et al. | |
| 6,669,980 B2 | 12/2003 | Hansen | |
| 6,670,607 B2 | 12/2003 | Wood et al. | |
| 6,737,463 B2 | 5/2004 | Yadav et al. | |
| 6,743,463 B2 | 6/2004 | Weber et al. | |
| 6,746,869 B2 | 6/2004 | Pui et al. | |
| 6,764,720 B2 | 7/2004 | Pui et al. | |
| 6,811,090 B2 | 11/2004 | Yogi et al. | |
| 6,861,088 B2 | 3/2005 | Weber et al. | |
| 6,933,331 B2 | 8/2005 | Yadav et al. | |
| 6,936,761 B2 * | 8/2005 | Pichler | 136/256 |
| 6,989,169 B2 | 1/2006 | Ripoll et al. | |
| 7,247,338 B2 | 7/2007 | Pui et al. | |
| 7,279,322 B2 | 10/2007 | Pui et al. | |
| 2002/0007869 A1 | 1/2002 | Pui et al. | |
| 2002/0065553 A1 | 5/2002 | Weber | |
| 2002/0151004 A1 | 10/2002 | Craig | |
| 2003/0143315 A1 | 7/2003 | Pui et al. | |
| 2003/0161937 A1 | 8/2003 | Leiby et al. | |
| 2003/0236514 A1 | 12/2003 | Schwarz | |
| 2004/0069632 A1 | 4/2004 | Ripoll et al. | |
| 2004/0081745 A1 | 4/2004 | Hansen | |
| 2004/0161498 A1 | 8/2004 | Ripoll et al. | |
| 2004/0177807 A1 | 9/2004 | Pui et al. | |
| 2004/0200729 A1 | 10/2004 | Boulais et al. | |
| 2004/0226602 A1 * | 11/2004 | Durr et al. | 136/256 |
| 2004/0234748 A1 | 11/2004 | Stenzel | |
| 2004/0241315 A1 | 12/2004 | Pui et al. | |
| 2005/0015046 A1 | 1/2005 | Weber et al. | |
| 2005/0023368 A1 | 2/2005 | Valpey et al. | |
| 2005/0055078 A1 | 3/2005 | Campbell | |
| 2005/0064008 A1 | 3/2005 | Bucay-Couto et al. | |
| 2005/0074478 A1 | 4/2005 | Ofstead et al. | |
| 2005/0075714 A1 | 4/2005 | Cheng et al. | |
| 2005/0101020 A1 | 5/2005 | Salem et al. | |
| 2005/0116070 A1 | 6/2005 | Ganan Calvo et al. | |
| 2005/0149177 A1 | 7/2005 | Weber et al. | |
| 2005/0158372 A1 | 7/2005 | O'Leary et al. | |
| 2005/0175772 A1 | 8/2005 | Worsham et al. | |
| 2005/0211294 A1 * | 9/2005 | Chittibabu et al. | 136/263 |
| 2005/0222485 A1 | 10/2005 | Shaw et al. | |
| 2005/0277577 A1 | 12/2005 | Hunter et al. | |
| 2006/0002973 A1 | 1/2006 | Barry et al. | |
| 2006/0021649 A1 * | 2/2006 | Kuroda et al. | 136/263 |
| 2006/0024810 A1 | 2/2006 | Khadkikar et al. | |
| 2006/0038027 A1 | 2/2006 | O'Connor | |
| 2006/0057259 A1 | 3/2006 | Ripoll et al. | |
| 2006/0062820 A1 | 3/2006 | Gertner et al. | |
| 2006/0067968 A1 | 3/2006 | Chudzik et al. | |
| 2006/0078922 A1 | 4/2006 | Edwards | |
| 2006/0088566 A1 | 4/2006 | Parsonage et al. | |
| 2006/0099235 A1 | 5/2006 | Blakstvedt et al. | |
| 2006/0100568 A1 | 5/2006 | Tan | |
| 2007/0151601 A1 * | 7/2007 | Jung et al. | 136/263 |

FOREIGN PATENT DOCUMENTS

| | | |
|---|---|---|
| CA | 2520702 | 10/2004 |
| CH | 0550022 A | 6/1974 |
| CN | 1052695 A | 7/1991 |
| CN | 1651604 A | 8/2005 |
| DE | 19846656 A1 | 4/1999 |
| DE | 19909333 A1 | 11/1999 |
| EP | 0234841 A2 | 9/1987 |
| EP | 0258016 A1 | 3/1988 |
| EP | 0270356 A2 | 6/1988 |
| EP | 0258016 B1 | 9/1990 |
| EP | 0405884 A1 | 1/1991 |
| EP | 0429234 A2 | 5/1991 |
| EP | 0434616 A1 | 6/1991 |
| EP | 0429234 A3 | 12/1991 |
| EP | 0434616 B1 | 11/1995 |
| EP | 0429234 B1 | 10/1998 |
| EP | 1355537 A1 | 10/2003 |
| EP | 1364718 A1 | 11/2003 |
| ES | 2180405AA | 2/2003 |

(56) References Cited

FOREIGN PATENT DOCUMENTS

| | | |
|---|---|---|
| JP | 06242273 A2 | 9/1994 |
| JP | 2004531365 T2 | 10/2004 |
| MX | 3006862 A | 10/2004 |
| WO | WO-9100915 A1 | 1/1991 |
| WO | WO-9107487 A1 | 5/1991 |
| WO | WO-9307465 A1 | 4/1993 |
| WO | WO-9713503 A1 | 4/1997 |
| WO | WO-9749484 A1 | 12/1997 |
| WO | WO-9803267 A1 | 1/1998 |
| WO | WO-9856894 A1 | 12/1998 |
| WO | WO-9903517 A1 | 1/1999 |
| WO | WO-9930812 A1 | 6/1999 |
| WO | WO-9930835 A1 | 6/1999 |
| WO | WO-9931019 A1 | 6/1999 |
| WO | WO-0187491 A1 | 11/2001 |
| WO | WO-02060275 A1 | 8/2002 |
| WO | WO-02060591 A1 | 8/2002 |
| WO | WO-03028622 A2 | 4/2003 |
| WO | WO-03082363 A1 | 10/2003 |
| WO | WO-2004047882 A2 | 6/2004 |
| WO | WO-2005074913 A2 | 8/2005 |
| WO | WO-2006003504 A1 | 1/2006 |
| WO | WO-2007089881 A2 | 8/2007 |
| WO | WO-2007089881 A3 | 8/2007 |

OTHER PUBLICATIONS

Nanorainbows: Graded Semiconductor Films from Quantum Dots, J. Am. Chem. Soc., 2001.*
Fujimoto et al., "Dye Sensitized Solar Cells Fabricated by Electrospray Coating Using TiO2 Nanocrystal Dispersion Solution", Journal of the Electrochemical Society, Mar. 14, 2006.*
www.crititech.com/technology, website, (Jun. 5, 2002), 5 pages.
et al., "State of the art overview and forecasts based on existing information of nanotechnology in the field of nanomaterials", Work Documents on Nanomaterials, (2004),75 pages.
Adachi, M., et al., "High-efficiency unipolar aerosol charger using a radioactive alpha source", Aerosols : Science, Industry, Health, and Environment : Proceedings of the Third International Aerosol Conference,, Sep. 24-27, 1990, Kyoto International Conference Hall, Kyoto, Japan / editors, Senichi Masuda, Kanji Takahashi ; Pergamon Press, NY,(1990),439-441.
Adachi, M., et al., "Unipolar and Bipolar Diffusion Charging of Ultrafine Aerosol Particles", J. Aerosol Sci., 16(2), (1985), 109-123.
Alexis, Frank, et al., "In vitro study of release mechanisms of paclitaxel and rapamycin from drug-incorporated biodegradable stent matrices.", Journal of Controlled Release, 98(1), (2004),67-74.
Buscher, P., et al., "Performance of a unipolar square wave diffusion charger with variable nt-product", J. Aerosol Sci., 25(4), (1998),651-663.
Chen, D., et al., "Design and Evaluation of a Nanometer Aerosol Differential Mobility Analyzer (Nano-DMA)", J. Aerosol Sci.,29(5/6), (1998),497-509.
Chen, Da-Ren, et al., "Electrospraying of Conducting Liquids for Monodisperse Aerosol Generation in the 4nm to 1.8nm Diameter Range", J.Aerosol Sci., 26(6), (1995),963-977.
Chen, Da-Ren, et al., "Experimental Investigation of Scaling Laws of Electrospraying: Dielectric Constant Effect", Aerosol Science and Technology, 27(3), (1997),367-380.
Fuchs, N. A., "On the Stationary Charge Distribution on Aerosol Particles in a Bipolar Ionic Atmosphere", Geodis: Pura. Appl.; vol. 56, (1963),185-193.
Ganan-Calvo, Alfonso, "Generation of Steady Liquid Microthreads and Micron-Sized Monodisperse Sprays in Gas Streams.", Phys. Rev. Lett., 80(2), (1998), 285-288.
Ganan-Calvo, Alfonso M., "New microfluidic technologies to generate respirable aerosols for medical applications", J. of Aerosol Sci., 30(Suppl. 1), (1993), S541-S542.
Hoppel, W. A., et al., "The Nonequililbrium Character of the Aerosol Charge Distribution Produced by Neutralizers", Aerosol Sci. & Technol., 12, (1990),471-496.
Jouyban, A, et al., "A simple relationship between dielectric constant of mixed solvents with solvent composition and temperature", Int J Pharm., 269(2), (2004), 353-60.
Lui, Benjamin, et al., "On unipolar dissision charging of aerosol particles in the continuum regime", J. Colloid Interface Sci., 58, (1977),142-149.
Pui, David, et al., "Nanometer Particles: A New Frontier for Multidisciplinary Research", J. Aerosol Sci., 28(4), (1997), 539-544.
Pui, D., et al., "Unipolar Diffusion Charging Ultrafine Aerosols", Aerosol Sci. Techn., 8, (1988), 173-187.
Puskas, Judit E., et al., "Polyisobutylene-based biomaterials", Journal of Polymer Science Part A: Polymer Chemistry, 42(13), (2004), 3091-3109.
Ranade, S. V., et al., "Physical characterization of controlled release of paclitaxel from the TAXUS Express2 drug-eluting stent", J Biomed Mater Res A., 71(4), (2004), 625-34.
Re, Maria-Ines, "Formulating Drug Delivery Systems by Spray Drying", Drying Technology, 24(4), (2006), 433-446.
Romay, Francisco J., et al., "Free electron charging of ultrafine aerosol particles", J. Aerosol Sci, 23(7), (1992),679-692.
Romay, Francisco J., et al., "On the Combination coefficient of positive ions with ultrafine neutral particles in the transition and free—molecule regimes", Aerosol Sci. Techn., 17, (1992), 134-147.
Romay, Francisco J., et al., "Unipolar Diffusion Charging of Aerosol Particles at Low Pressure", Aerosol Sci. Techn, 15, (1991),60-68.
Rulison, A. J., et al., "Scale-up of electrospray atomization using linear arrays of Taylor cones", Review of Scientific Instruments, 64(3), (1993), 683-686.
Salata, Oleg V., et al., "Tools of Nanotechnology: Electrospray", Current Nanoscience, 1(1), (2005), 25-33.
Shi, Y., et al., "Current advances in sustained-release systems for parenteral drug delivery", Expert opinion on Drug Delivery, 2(6), (2005), 1039-58.
Songstad, D. D., et al., "Advances in alternative DNA delivery techniques", Plant Cell, Tissue and Organ Culture, 40, (1995), 1-15.
Szycher, M., et al., "Drug-eluting stents to prevent coronary restenosis", http://www.implantsciences.com/pdf/IMXpaperv2-rev2.pdf, (2002) ,1-10.
Verhoeven, M., et al., "DSIMS characterization of a drug-containing polymer-coated cardiovascular stent", J. Controlled Release, 96, (2004),113-121.
Wiedensohler, A., et al., "A novel unipolar charger for ultrafine aerosol particles with minimal particle losses", J. Aerosol Sci., 25(4), (1994),639-650.
Yokoyama, T., et al., "Nanoparticle Technology for the Production of Functional Materilas", Hosokawa Powder Technology Research Institute, KONA No. 23, (2005), 7-17.
Young, Timothy J., et al., "Phospholipid-Stabilized Nanoparticles of Cyclosporine A by Rapid Expansion from Supercritical to Aqueous Solution", AAPS Pharm. SciTech. 5(1) Article 11, (2003), 1-16.
BINKS Electrostatic spray painting equipment, Product Literature, 7 pages.
"Final Program—Minnesota Nanotechnology Summit", Minnesota Nanotechnology Summit: Opportunities and Challenges, http://www.particlesociety.org/Spring2000.html Minneapolis, MN, (Mar. 17, 2000), 4 pgs.
"International Application Serial No. PCT/US2007/002718, International Preliminary Report on Patentability mailed Aug. 14, 2008", 12 pgs.
"Small Dots, Fine Patterning", Hamamatsu Photonics K.K., [Online]. Retrieved from the Internet: <http://jp.hamamatsu.com/en/rd/publication/nature/common/pdf/nature_0803.pdf>, (Mar. 2008), 1 pg.

* cited by examiner

METHODS AND APPARATUS FOR FORMING PHOTOVOLTAIC CELLS USING ELECTROSPRAY

RELATED APPLICATION

This application claims priority to U.S. Provisional Application Ser. No. 60/869,205 (entitled MULTIPLE COMPOSITION AND MORPHOLOGY STRUCTURED DEPOSITION USING ELECTROSPRAY, filed Dec. 8, 2006), which is incorporated herein by reference.

TECHNICAL FIELD

This patent document pertains generally to solar cells, and more particularly, but not by way of limitation, to photovoltaic cells formed by electrospray.

BACKGROUND

Solar cells can be an alternative source of abundant, clean energy. However, solar power can be significantly more expensive than electrical power generated by coal and natural gas. This is due, in part, to manufacturing costs associated with the photovoltaic cells that are used to convert sunlight to electricity. Among such costs are the use of silicon crystals and the need for clean room batch fabrication processes. Incremental cost savings may be achieved through economies of scale. New solar devices and fabrication processes are needed that may reduce the cost of solar power and enable new applications.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1A:
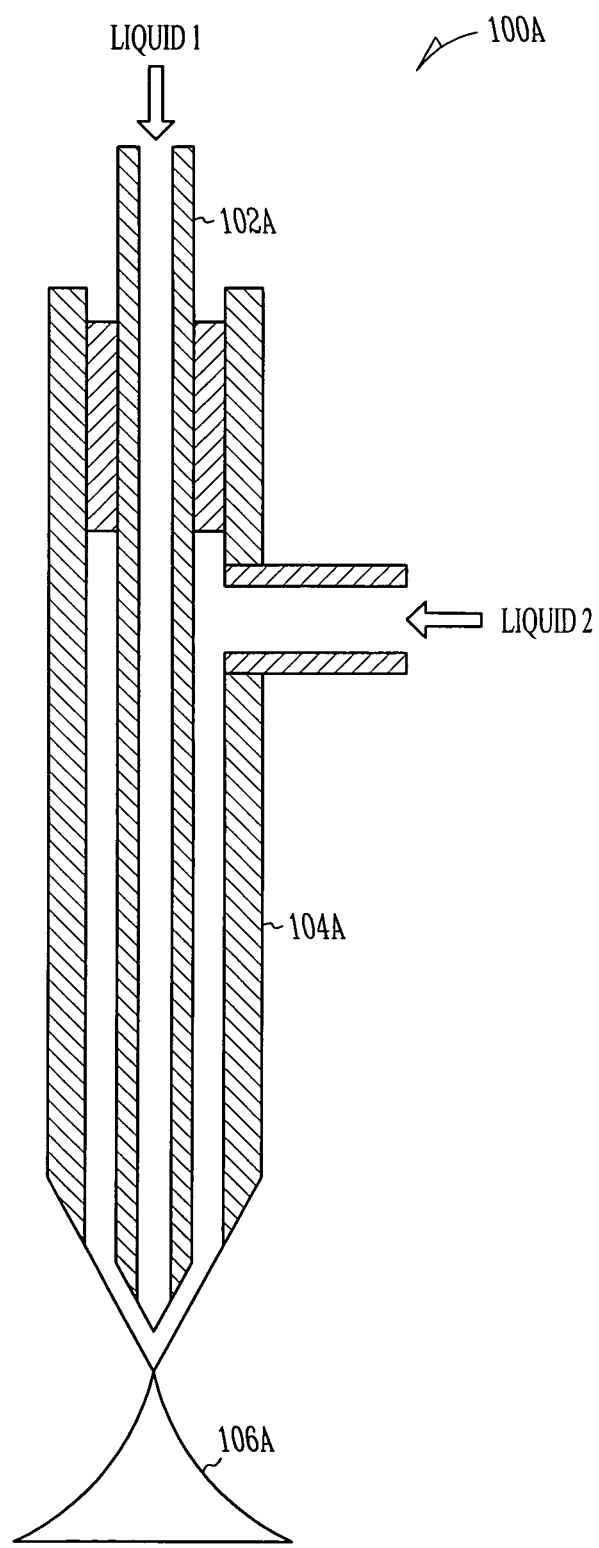
FIGS. 1A and 1B illustrate examples of a portion of an electrospray apparatus and electrospray process, respectively.

Photovoltaic devices can be used to generate solar power. Photovoltaic devices can be formed with a $TiO_2$ nanostructured film as a light sensitive material and tin dioxide ($SnO_2$) or indium tin oxide (ITO) as a light transparent electrode. Deposition of nanostructured $TiO_2$ has been performed using a preparation of a colloidal suspension containing $TiO_2$ powder, followed by sintering to form a porous, sponge-like structure. Sintering is used to remove organic binders and surfactants and to form a good electrical contact between adjacent $TiO_2$ particles in the porous layer, and also as an electrical contact between the porous $TiO_2$ film and $SnO_2$ or ITO electrode. Increasing sintering temperature can speed the removal of the binders and the surfactants, but as the sintering temperature increases so can the average pore size of the $TiO_2$ film. High sintering temperatures can also limit selection of the substrate to glasses.

The porous $TiO_2$ film can be sensitized to increase solar light absorption at different wavelengths by dip coating in a sensitizer. Movement of the sensitizer into the pores can take hours and still not reach the inner portions due to surface tension. The increased manufacturing time can also increase manufacturing costs.

Solar power can also be generated using dye-sensitized solar cells (DSSC) containing light absorptive nanoparticles, such as $TiO_2$. Such photovoltaic devices may reduce the cost of solar power because they can be made of low-cost materials and be manufactured using less elaborate and less expensive processing equipment. However, the fabrication of DSSCs can also require sintering at greater than 450° C. to achieve sufficient interconnectivity between nanoparticles and enhance adhesion between the particles and a transparent substrate. As noted, the high sintering temperature can limit selection of the transparent substrate to rigid transparent materials, such as glass. Therefore, the DSSC is not readily able to use a flexible substrate. Unfortunately, use of a rigid substrate can limit DSSC manufacture to batch processing methods.

In one example embodiment of the present invention, a photovoltaic structure includes a core including a metal and a light absorptive coating enclosing the core. The photovoltaic structure also includes an electrolyte adjoining the light absorptive coating. The photovoltaic structure also includes a photosensitive nanostructure layer adjacent the electrolyte.

In another example embodiment, a photovoltaic structure includes a first conductive layer and a second conductive layer spaced from the first conductive layer. The photovoltaic structure also includes a photosensitive quantum dot region located between the first conductive layer and the second conductive layer. The photosensitive quantum dot region includes quantum dots having a diameter size gradient in a direction normal to a major surface of the first conductive layer.

In another example, a method includes applying a negative bias to a flexible conductive substrate. The method also includes applying positively charged nanoparticles to flexible conductive substrate, the nanoparticle region including at least one of dye sensitized $TiO_2$ nanoparticles and quantum dots. The method also includes applying an electrolyte to the nanoparticles supported by the flexible conductive substrate, the electrolyte, and applying a catalyst to the electrolyte. The use of a flexible substrate can enable use of continuous processing technologies, such as roll-to-roll manufacturing which can provide lower cost manufacturing.

In another example, a system includes a first roller including a plurality of wires and a second rollers to receive the plurality of wires. The system also includes a plurality of coaxial electrospray dispensers positioned to deposit at least a coating of nanoparticles on the plurality of wires. The system also includes a plurality of heaters spaced in relation to at least one of the plurality of wires and coaxial electrospray dispensers.

FIG. 1A illustrates an example of a portion of an electrospray apparatus 100A. Apparatus 100A includes an inner capillary 102A and an outer capillary 104A coaxially positioned and configured to receive and dispense different solutions in a specified spray pattern 106A. In various examples, one or both of the solutions dispensed include nanoparticles. Inner capillary 102A and outer capillary 104A can also be used to dispense solutions containing quantum dots. In an example, inner capillary 102A and outer capillary 104A contain different solutions, one of which includes nanoparticles, such as $TiO_2$ nanoparticles, and the other includes one or more quantum dot semiconductor materials. In another example, capillary 102A and capillary 104A include solutions containing the same quantum dot materials with different diameter, one of which includes quantum dots having first range of diameters and the other includes quantum dots having a second range of diameters. In another example, outer capillary 104A is used to condition the flow of the solution dispensed from capillary 102A, or to improve the spray pattern 106A which in one embodiment is conoidal with curved sides in shape.

Figure 1B:
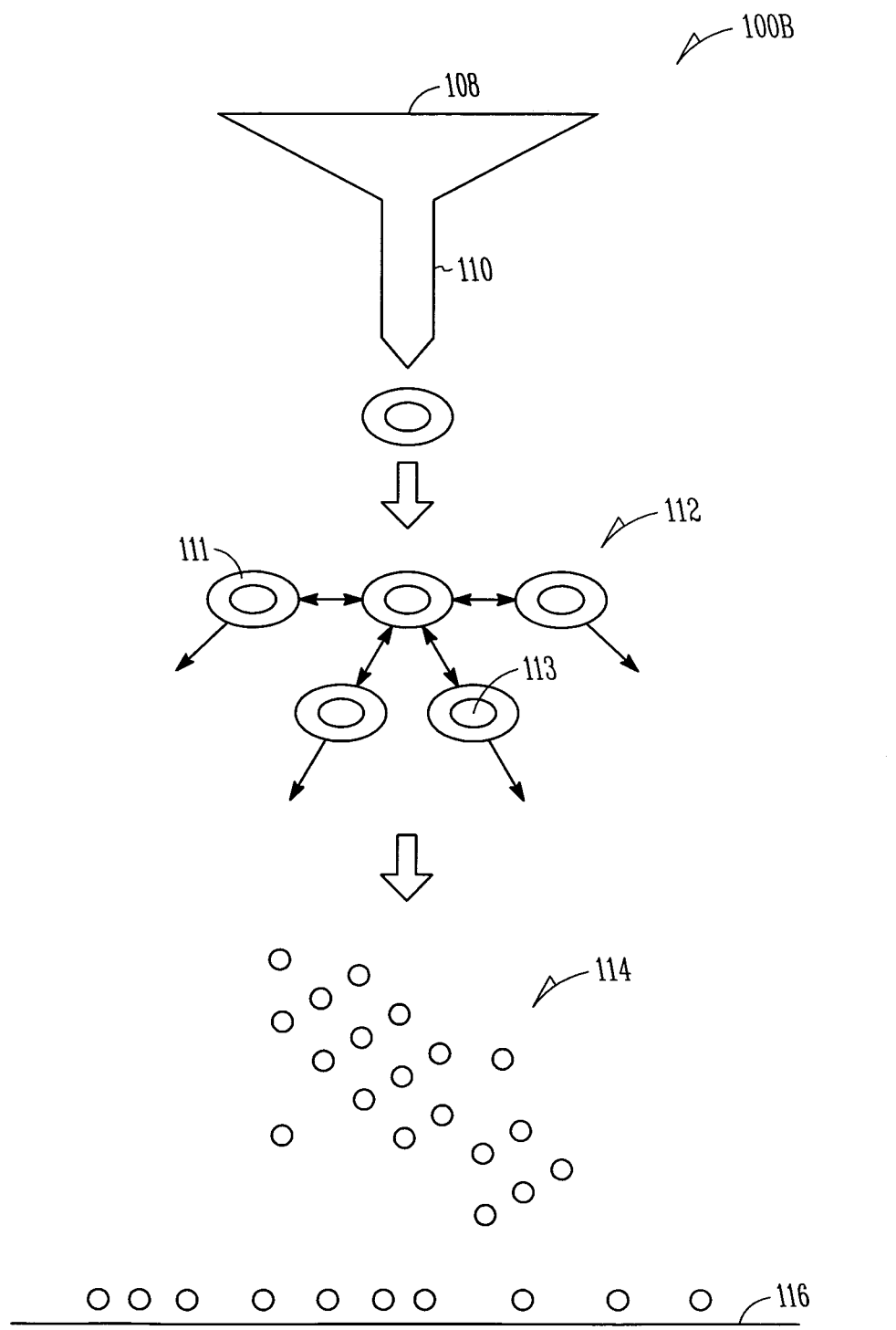

FIG. 1B illustrates an example of an electrospray process 100B. A nanofilament 110 containing a solution of positively charged nanoparticles 112 emerges from cone 108 at high velocity. The positively charged nanoparticles repel, providing a conoidal shape as shown at 106B. In one embodiment, the particles follow an electric field and the shape of this output region may flow around the wire or have a markedly concave surface on the flat vertical lines making up the conoidal or spray zone region. region with a high cross-sectional area. The solution 111 enclosing the positively charged nanoparticles 113 can be a solvent, which substantially evaporates before reaching the target substrate 116. In an example, the solvent 111 is an active component, such as a dye or an electrolyte. The positively charged nanoparticles 114 can be neutralized by a negative charge placed on the target substrate 116. Consequently, the positively charged nanoparticles can adhere to substrate 116. The target substrate 116 can also contain a neutral charge. In various examples, the target substrate 116 is a transparent conducting substrate, such as $SnO_2$ and indium tin oxide. In various examples, the target substrate 116 is a metal. In various embodiments, the target substrate is a transparent flexible substrate 116 formed of a plastic that can be made to conduct electrical charge.

Photovoltaic structures can be formed on a flexible substrate by use of a highly charged electrospray or electronanospray such as described above. Positively charged $TiO_2$ nanoparticles can be deposited on the substrate that is negatively charged or has a neutral charge. Dye particles can be sprayed and attached to the $TiO_2$ nanoparticles during the aerosol phase. Quantum dots formed of II-VI and III-V compound semiconductor materials can also be used in the photovoltaic structures described herein. The quantum dots can be electrosprayed onto a flexible substrate in a manner similar to the application of the $TiO_2$ nanoparticles. In addition, a composite of quantum dots and $TiO_2$ nanoparticles can be incorporated into a photovoltaic structure to absorb the solar spectrum and to generate one or more excitons per photon providing enhanced conversion efficiency. In an example, $TiO_2$ nanoparticles and II-VI compound semiconductor quantum dots having different diameters are co-sprayed onto a flexible substrate. The thickness of the light absorption region containing either or both the $TiO_2$ nanoparticles and the quantum dots is from about 8 microns to about 10 microns. Examples of materials and methods that can be used to form photovoltaic structures that can generate solar power are provided in Table I.

Figure 2:
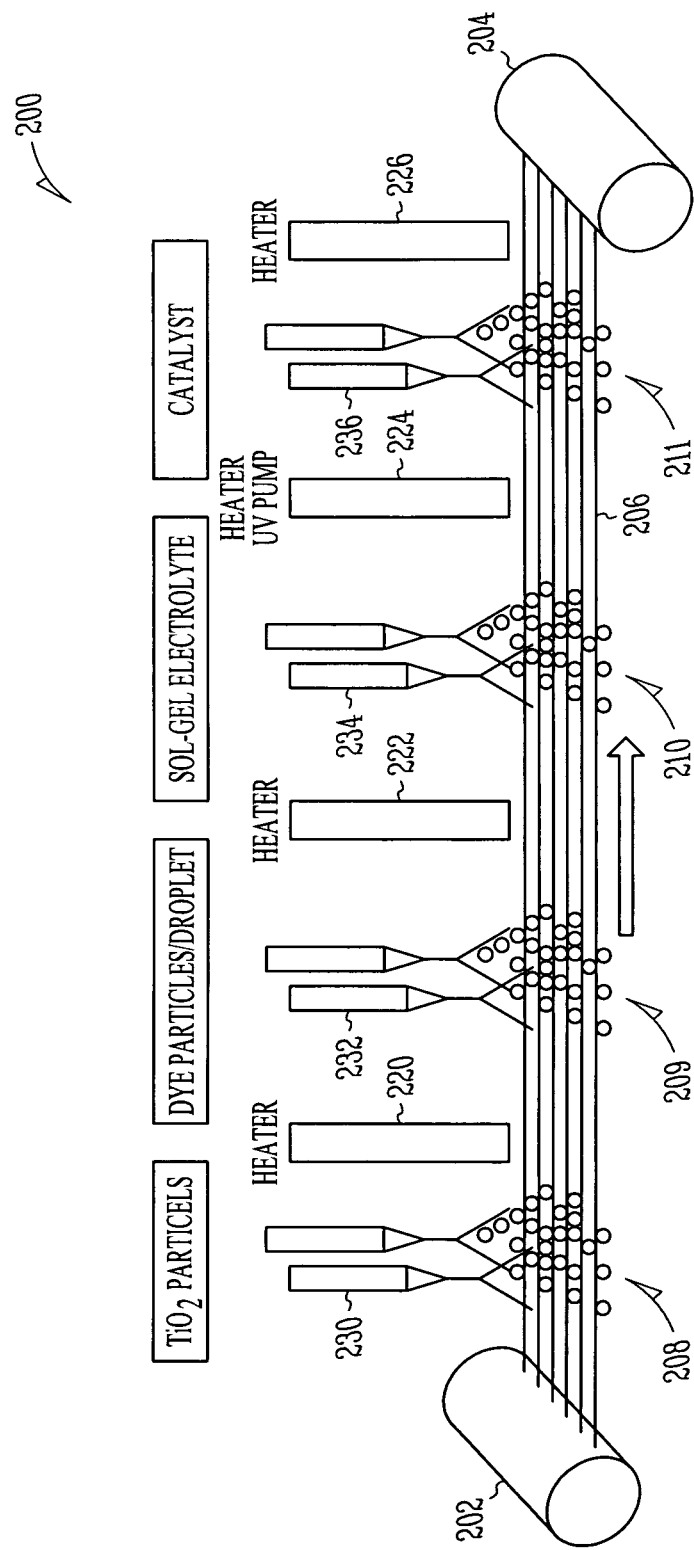
FIG. 2 illustrates an example of a system for producing photovoltaic structures on a flexible substrate.

FIG. 2 illustrates an example of a system 200 for producing photovoltaic structures on a flexible substrate. System 200 includes at least one supply spool 202 containing one or more electrically conductive wires 206 that are drawn by at least one storage spool 204. The wires can be any suitable metal or metal alloy. In further embodiments, the conductive wire may have a non conductive thread or strip shaped core with an added conductive layer or coating. Other cores that may be used include a polymer or ceramic composite material, such as a ceramic-co-polymer blend made by blending a self-assembling molecule called a diblock copolymer with a ceramic.

The system may also include heaters, 220, 222, 224, and 226 that can be configured to dry, cure, sinter, stabilize, catalyze, and fix the respective coatings as they are drawn by storage spool 204. Heater 224 can be any ultraviolet source, such as an ultraviolet lamp, suitable for curing sol-gel such as a gel or semisolid material. Heaters 220, 222, and 226 can be any suitable heater. Electrospray apparatus 230, 232, 234, and 236 can each be an apparatus, such as electrospray apparatus 100A described above.

TABLE I

| Substrate | Conductive wire | Conductive wire | Plastic Or flexible conductive composite | Plastic |
|---|---|---|---|---|
| Nanoparticle Electrode | Electronanospray $TiO_2$ powder solution with or without sintering | Electronanospray $TiO_2$ powder solution without sintering or or electronanospray quantum dot layer with $TiO_2$ | Electronanospray $TiO_2$ powder solution without sintering or electronanospray quantum dot layer with $TiO_2$ | Electronanospray $TiO_2$ powder solution without sintering or electronanospray quantum dot layer with $TiO_2$ |
| Sensitizer dye (absorber) Dye (Ru-Dye (N719)) | Electrospray the dye solution in to nanoporous $TiO_2$ | Electrospray the dye solution in to nanoporous $TiO_2$ | Electrospray the dye solution in to nanoporous $TiO_2$ | Electrospray the dye solution in to nanoporous $TiO_2$ |
| Electrolyte I-/I3- (iodide/triiodide) | | Electrospray polymer gel or solid electrolyte | | Electrospray polymer gel or solid electrolyte |
| Counter electrode catalyst Carbon or platinum | Electrospray carbon black particles | | Electrospray carbon black particles | |
| Electrical contact Indium Tin Oxide Sealant/ Moisture Barrier Hydrophobic polymer Quantum Dot Layers | | | | |
| PbSe PbS CdTe/ZnS CdSe/ZnS ZnSe | Electronanospray | Electronanospray | Electronanospray | Electronanospray |

Conductive wires 206 can be fed and pulled across electrospray apparatus 230, 232, 234, and 236 to provide successive applications of coatings that, upon completion, form photovoltaic structures, such as photovoltaic wires. The rate at which the wires are drawn can be adjusted to obtain the desired thickness of a respective coating based on the deposition rates provided by electrospray apparatus 230, 232, 234, and 236. In an example, the rate at which the wires are drawn may be based on the time to perform one or more of dry, cure, sinter, stabilize, catalyze, and fix a respective coating.

In the example illustrated in FIG. 2, the wires 206 can be biased to a negative potential or connected to a circuit or earth ground to attain a neutral potential while moving between spool 202 and spool 204. Positively charged $TiO_2$ nanoparticles in a solution are applied by an electospray apparatus 230 onto the wires 206 and sintered using heater 220. The $TiO_2$ nanoparticle solution conforms to the shape of the wires 206. Where the $TiO_2$ nanoparticles are not sintered, heater 230 may be optionally used. After formation of a concentric coating of $TiO_2$ nanoparticles around the wires 206, a dye particle solution is applied by electrospray apparatus 232 onto and into the nanopores of the $TiO_2$ nanoparticles. The dyed $TiO_2$ nanoparticles can be heated to speed the drying process. The dye can be a photoactive pigment, such as an anthocyanin. Following attachment of the dye particles to the $TiO_2$ nanoparticles, a sol-gel electrolyte, such as iodide/triiodide, can be applied by an electrospray apparatus 234 onto dried, dyed $TiO_2$ nanoparticles.

The sol-gel electrolyte conforms the shape of the wires 206 encasing the dyed $TiO_2$ nanoparticles. The heater 224 can be used to cure the sol-gel electrolyte. In an example, a UV lamp can be used for photopolymerization of the sol-gel electrolyte. In another example, a conductive polymer is applied by an electrospray apparatus as a substitute for the sol-gel electrolyte. In various other examples, a liquid or a solid electrolyte is substituted for the sol-gel electrolyte. After curing the sol-gel electrolyte, a catalyst can be applied by electrospray apparatus 236 onto the surface of the sol-gel electrolyte thereby encapsulating it. The catalyst can be heated to assist in fixing the catalyst to the sol-gel electrolyte. In an example, the catalyst is an electrochemically active catalyst. The catalyst can be platinum or a porous carbon counter-electrode. The catalyst may contain palladium. In an example, the catalyst is a mixture of carbon black, graphite and $TiO_2$ nanoparticles. The carbon and graphite provide electrical conduction, and the $TiO_2$ nanoparticles function as a binder for the mixture. In another example, the catalyst is a material suitable for triiodide reduction or electrolyte reduction.

The photovoltaic wires 206 can be used to form a solar fabric and photovoltaic ribbons. In various examples, a flexible substrate such as a plastic substrate may be substituted for wires 206. The processes and apparatus described can also be applied to rigid substrates and complex three-dimensional surfaces formed of the same or different material.

Figure 3A:
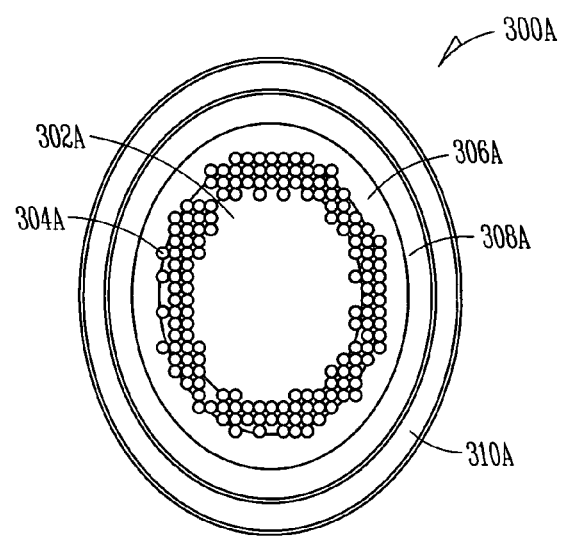
FIGS. 3A, 3B and 3C illustrate examples of a photovoltaic wire manufactured with a system that includes electrospray apparatus.
Figure 3B:
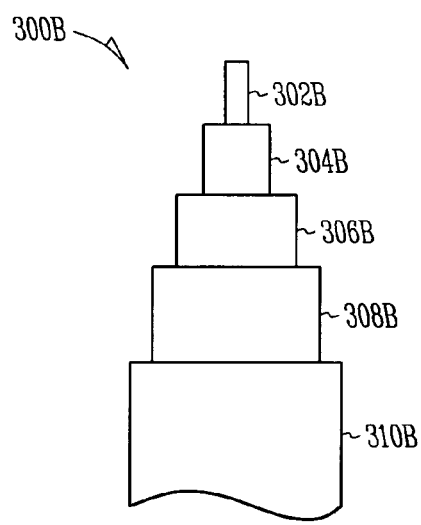
Figure 3C:
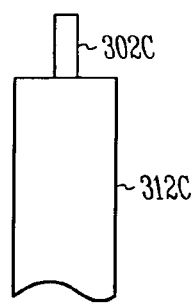

FIGS. 3A-C illustrate examples of photovoltaic wires manufactured with a system that includes electrospray apparatus, such as system 200. In FIG. 3A is shown a cross-section of a photovoltaic wire 300A that is formed using the process described above. Conductive core 302A is enclosed by, and in contact with, a light absorbing region 304A, such as dyed $TiO_2$ nanoparticles. In various examples, absorbing region 304A is a region including quantum dots. The absorbing region 304A can also be a region containing a mixture of $TiO_2$ nanoparticles and quantum dots. In various examples, absorbing region 304A contains quantum dots formed of different semiconductor materials having the same or different diameters. Enclosing region 304A is an electrolyte region 306A that can be a liquid electrolyte, a solid electrolyte, or a sol-gel electrolyte. A transparent conductor 308A can surround the electrolyte region 306A. In various examples, the transparent conductor 308A is indium tin oxide or a transparent conductive carbon nanotube film. In an example, the transparent conductor 308A is a conductive ink. In another example, the transparent conductor 308A is a plastic that is made to conduct electrical charge. In yet another example, the transparent conductor 308A is a conductive polymer.

A transparent insulator 310A surrounds the transparent conductor 308A. The insulator 310A can be any suitable material that is electrically insulating, such as a plastic coating or other suitable non-conducting polymeric film. The insulator 310A can also be selected that provides moisture resistance or is an oxygen barrier. In an example, a moisture barrier formed of a transparent hydrophobic polymer as, or in addition to, the insulator 310A.

In FIG. 3B shows a side view of a photovoltaic wire 300B that is formed using an electrospray process, such as described above. Photovoltaic wire 300B includes a conductive core 302B, light absorbing region 304B, electrolyte region 306B, transparent conductor 308B, and insulator 310A. Here, each region 304B, 306B, 308B and 310B may be formed as a separate layer.

FIG. 3C shows a side view of a photovoltaic wire 300C that is also formed using an electrospray apparatus. Here, photovoltaic wire 300C includes a nanocomposite coating 312C surrounding conductive core 302C. In various examples, the nanocomposite coating 312C is a nanoporous coating. Coating 312C can include $TiO_2$ nanoparticles, formed with and without sintering, and quantum dots formed from the same or different semiconductor materials. The size of the $TiO_2$ nanoparticles and the quantum dots can be varied in the radial direction. In an example, the average diameter of the quantum dots contained in the nanocomposite coating 312C decrease in the radial direction toward the outer surface of nanocomposite coating 312C. In another example, the average diameter of the quantum dots contained in the nanocomposite coating 312C increase in the radial direction toward the outer surface of nanocomposite coating 312C. The nanocomposite coating 312C can include a mixture of $TiO_2$ nanoparticles and semiconductor-based quantum dots. In an example, the nanocomposite coating 312C has a bimodal distribution of $TiO_2$ nanoparticles and semiconductor quantum dots. The bimodal distribution here is one where the $TiO_2$ nanoparticles have a narrow range of average sizes that differs from the narrow range of average sizes of the semiconductor quantum dots. In an example, the $TiO_2$ nanoparticles and the semiconductor quantum dots are co-sprayed using an electrospray apparatus as described.

Figure 4:
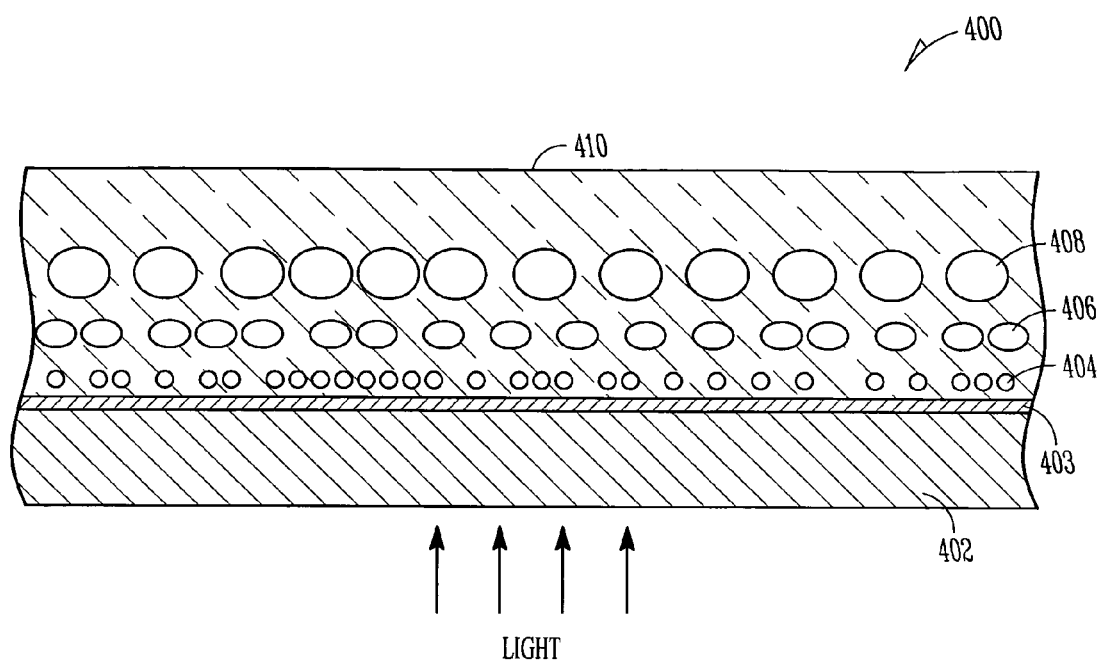
FIG. 4 illustrates an example of a photovoltaic structure with a transparent substrate material.

FIG. 4 illustrates an example of a photovoltaic structure 400 with a transparent substrate. The photovoltaic structure 400 can include a transparent substrate 402 that is flexible, such as a plastic. The substrate 402 can also be formed of a rigid material, such as an indium tin oxide, a tin dioxide and a zinc oxide. The substrate can also be a flexible polymeric film. The substrate 402 can also be formed of a material that is conformable to various geometric shapes. A moisture barrier, such as a transparent hydrophobic polymer, or an oxygen barrier can be applied to the substrate 402 along the light impinging to improve operation lifetimes.

A conductive layer 403 can be applied to the substrate 402. In an example, the conductive layer 403 includes an inorganic coating, such as indium tin oxide. The conductive layer 403 can also be a conductive ink. The conductive layer 403 can also be formed with transparent conductive carbon nanotubes. In an example, a conductive layer is electroplated into the surface of conductive region 403. In another example, a conductive layer is electroplated into the surface of the substrate 402.

Nanoparticle layers 404, 406, and 408 can be applied to the conductive region 403 and surrounded by a conductive material 410, as described above. In an example, a conductive layer is electroplated into the surface of conductive material 410. 403 Although only three nanoparticle layers are illustrated, photovoltaic structure 400 can include fewer or more layers as desired. Nanoparticle layers 404, 406, and 408 can include dye-sensitized $TiO_2$ nanoparticles. The dye can be any suitable dye with absorption characteristics in the solar spectrum. In an example, the dye is Ru-Dye (N719). In another example, the dye is photoactive pigment, such as an anthocyanin.

The nanoparticle layers 404, 406, and 408 in one embodiment, may each include only a specified size particle or a specified range of sizes. In an example, the range of nanoparticle size is from about 2 nm to about 10 nm. The layers 404, 406, and 408 can also be formed with quantum dot materials having quantum dots of a specified diameter or range of diameters. Layers 404, 406, and 408 may include only one quantum dot material, or a range of quantum dot materials. In an example, range of quantum dot diameters is from about 2 nm to about 10 nm. Examples of quantum dot materials include PbSe, PbS. CdTe/ZnS core/shell, CdSe/ZnS core/shell, and ZnSe.

In an example, layers 404, 406, and 408 include quantum dot materials with absorption in the wavelength range from about 360 nm to about 2500 nm. In another example, layers 404, 406, and 408 each includes one or more quantum dot materials with absorption by the quantum dots in a wavelength range from about 360 nm to about 460, from about 490 to about 620 nm, from about 620 nm to about 780 nm, from about 800 nm to about 1000 nm, and/or from about 100 nm to about 2500 nm. Nanoparticle layers 404, 406, and 408 can also include $TiO_2$ nanoparticles and semiconductor quantum dots as described above. The distribution of $TiO_2$ nanoparticles and quantum dots can be bimodal. For example, the $TiO_2$ nanoparticles can be substantially all of one size or range of sizes, and the quantum dots can be substantially all another size or range of sizes.

Although nanoparticle layers 404, 406, and 408 are illustrated as being discrete-like with an increasing size gradient in a direction away from the substrate 402, the opposite size gradient can also be formed. The gradient can also be continuous. In general, due to quantum size effects, quantum dots with a larger diameters absorb photons having lower energies than quantum dots with smaller diameters. Thus, the size distribution of the quantum dots and the quantum dot materials can be used to shape the absorption characteristics of a photovoltaic structure.

The above description is intended to be illustrative, and not restrictive. For example, the above-described examples (or one or more aspects thereof) may be used in combination with each other. Other embodiments can be used, such as by one of ordinary skill in the art upon reviewing the above description. All patents, patent documents, and references cited herein are incorporated in their entirety as if each were incorporated separately.

The Abstract is provided to comply with 37 C.F.R. §1.72 (b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A photovoltaic structure comprising:
   a non-conductive core;
   a conductive layer on the non-conductive core;
   a photosensitive nano-composite nanoporous nanostructure layer at least partially formed by an electrospray process enclosing the conductive layer, the photosensitive layer containing $TiO_2$ nanoparticles, quantum dots, and a photoactive pigment dye, wherein the quantum dots comprise at least one of ZnSe, CdSe/Zn, CdTe/ZnS, PbS, and PbSe and the quantum dots include a plurality of different sizes;
   an electrolyte in sol-gel on the photosensitive layer;
   a catalyst encapsulating the sol-gel electrolyte;
   a transparent conductor surrounding the catalyst; and
   a transparent insulator surrounding the transparent conductor.

2. The photovoltaic structure of claim 1, wherein the catalyst includes at least one of carbon, carbon black particles, platinum, and palladium.

3. The photovoltaic structure of claim 1, wherein the nanostructure layer is to convert photons having energies ranging from about 0.5 eV to about 3.45 eV to electron-hole pairs.

4. The photovoltaic structure of claim 1, wherein the quantum dots include a diameter ranging from about 2 nm to about 10 nm.

5. The photovoltaic structure of claim 1, wherein the nanostructure layer includes a substantially homogeneous mixture of two or more quantum dots materials.

6. The photovoltaic structure of claim 1, wherein the nanostructure layer comprises a plurality of concentric layers, each of the concentric layers including at least one of a different quantum dot material and a different quantum dot size.

7. The photovoltaic structure of claim 1, wherein the electrolyte includes an ionic redox electrolyte.

8. The photovoltaic structure of claim 1, wherein the light absorptive coating includes an anthocyanin.

9. The photovoltaic structure of claim 1, wherein the substantially transparent conductor is a material comprising at least one of a conductive polymer, conductive carbon nanotubes, and a conductive metal oxide.

10. The photovoltaic structure of claim 1, wherein the photosensitive nanostructure layer includes a bimodal distribution of $TiO_2$ nanoparticles and quantum dots.

11. A photovoltaic structure comprising:
    a first conductive layer on a first conductive layer;
    a second conductive layer spaced from the first conductive layer;
    a photosensitive nano-composite nanoporous region quantum dot located between the first conductive layer and the second conductive layer, wherein the photosensitive quantum dot region includes $TiO_2$ nanoparticles and quantum dots having a diameter size gradient in a direction normal to a major surface of the first conductive layer, wherein the nano-composite nanoporous region encloses the first conductive layer, includes a photoactive pigment dye, wherein the quantum dots comprise at least one of ZnSe, CdSe/Zn, CdTe/ZnS, PbS, and PbSe;
    a catalyst encapsulating the second conductive layer;

a transparent conductor surrounding the catalyst; and
a transparent insulator surrounding the transparent conductor.

12. The photovoltaic structure of claim 11, wherein the quantum dots are coated with $TiO_2$ particles.

13. The photovoltaic structure of claim 11, wherein the diameters of the quantum dots located nearest the first conductive layer are less than the diameters of the quantum dots located nearest the second conductive layer.

14. The photovoltaic structure of claim 11, wherein the first conductive layer includes indium tin oxide.

15. The photovoltaic structure of claim 11, wherein the first conductive layer is a composite including a flexible plastic material and at least one conductive agent.

16. The photovoltaic structure of claim 15, wherein the conductive agent includes a conductive ink.

17. The photovoltaic structure of claim 11, wherein the first conductive layer includes a flexible polymeric film.

18. The photovoltaic structure of claim 17, wherein the flexible polymeric film is in contact with an inorganic coating.

19. The photovoltaic structure of claim 11, further comprising a transparent flexible plastic substrate adjoining the first conductive layer.

20. The photovoltaic structure of claim 11, further comprising a transparent moisture barrier adjoining the first conductive layer.

21. The photovoltaic structure of claim 11, further comprising a polymer sol-gel electrolyte in contact with the photosensitive region.

22. The photovoltaic structure of claim 11, wherein the sol-gel electrolyte includes redox $I^-/I_3$ electrolytes.

23. The photovoltaic structure of claim 11, wherein a thickness of the photosensitive region is from about 8 microns to about 10 microns in thickness.

24. The photovoltaic structure of claim 11, wherein the photosensitive quantum dot region is configured to absorb light from about 360 nm to about 2500 nm.

25. The photovoltaic structure of claim 11, further comprising a counter-electrode catalysts that includes black carbon.

26. The photovoltaic structure of claim 25, wherein the quantum dots and the $TiO_2$ nanoparticles have a bimodal distribution in the photosensitive quantum dot region.

27. A photovoltaic structure the photovoltaic structure comprising:
an electrically charged core including at least a conductive portion; and
a photosensitive electrically charged nanoporous nanostructure layer coating the core, wherein the at least partially formed by an electrospray process charged core and nanostructure layer charge are of opposite polarity and the nanostructure layer includes quantum dots, $TiO_2$ nanoparticles, a photoactive pigment die wherein the quantum dots comprise at least one of ZnSe, CdSe/Zn, CdTe/ZnS, PbS, and PbSe and the quantum dots include a plurality of different sizes;
a catalyst encapsulating the nanoporous nanostructure layer;
a transparent conductor surrounding the catalyst; and
a transparent insulator surrounding the transparent conductor.

28. A photovoltaic structure the photovoltaic structure comprising:
a first conductive layer;
a second conductive layer spaced from the first conductive layer; and
a photosensitive electrically charged nanoporous nanostructure layer located between the first conductive layer and the second conductive layer at least partially formed by an electrospray process, wherein the nanostructure layer includes quantum dots, $TiO_2$ nanoparticles, a photoactive pigment die wherein the quantum dots comprise at least one of ZnSe, CdSe/Zn, CdTe/ZnS, PbS, and PbSe, and wherein the quantum dots include a diameter size gradient in a direction normal to a major surface of the first conductive layer;
a catalyst encapsulating the second conductive layer;
a transparent conductor surrounding the catalyst; and
a transparent insulator surrounding the transparent conductor.

* * * * *